(12) United States Patent
Tanaka et al.

(10) Patent No.: US 7,968,990 B2
(45) Date of Patent: Jun. 28, 2011

(54) SEMICONDUCTOR DEVICE AND METHOD OF FABRICATING THE SAME

(75) Inventors: Junji Tanaka, Tokyo (JP); Junichi Kasai, Kanagawa (JP); Kouichi Meguro, Tokyo (JP); Masanori Onodera, Tokyo (JP); Koji Taya, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 617 days.

(21) Appl. No.: 11/654,704

(22) Filed: Jan. 17, 2007

(65) Prior Publication Data

US 2008/0169544 A1    Jul. 17, 2008

Related U.S. Application Data

(63) Continuation-in-part of application No. PCT/JP2006/300542, filed on Jan. 17, 2006.

(51) Int. Cl.
*H01L 23/02* (2006.01)

(52) U.S. Cl. .................................. 257/686; 257/777

(58) Field of Classification Search .................. 257/686, 257/777, 723, 724, 787
See application file for complete search history.

(56) References Cited

U.S. PATENT DOCUMENTS

| 6,838,761 | B2 * | 1/2005 | Karnezos ..................... 257/685 |
| 6,924,550 | B2 * | 8/2005 | Corisis et al. ................. 257/686 |
| 6,927,484 | B2 * | 8/2005 | Thomas et al. ............... 257/685 |
| 7,239,164 | B2 * | 7/2007 | Tamaki ........................ 324/763 |
| 7,332,801 | B2 * | 2/2008 | Low et al. .................... 257/686 |
| 7,723,839 | B2 * | 5/2010 | Yano et al. ................... 257/700 |

FOREIGN PATENT DOCUMENTS

| JP | 4148586    | 5/1992  |
| JP | 7183426    | 7/1995  |
| JP | 10200049   | 7/1998  |
| JP | 2002343899 | 11/2002 |
| JP | 2004327855 | 11/2004 |

* cited by examiner

*Primary Examiner* — S. V Clark (57) ABSTRACT

A method of fabricating a semiconductor device includes: mounting a semiconductor chip on a substrate; forming an upper connection terminal on a side of the substrate on which the semiconductor chip is mounted; forming a resin seal portion that seals the semiconductor chip and the upper connection terminal so that an upper surface of the upper connection terminal is exposed; and shaping the upper connection terminal so that the upper surface of the upper connection terminal becomes lower than an upper surface of the resin seal portion.

11 Claims, 11 Drawing Sheets

SEMICONDUCTOR DEVICE AND METHOD OF FABRICATING THE SAME

CROSS-REFERENCES TO RELATED APPLICATIONS

This is a continuation-in-part of International Application No. PCT/JP2006/300542, filed Jan. 17, 2006 which was not published in English under PCT Article 21(2).

BACKGROUND OF THE INVENTION

1. Field of the Invention

The present invention generally relates to a semiconductor device and a method of fabricating the semiconductor device, and more particularly, to a semiconductor device having multiple built-in semiconductor devices stacked and a method of fabricating the semiconductor device.

2. Description of the Related Art

In recent years, there is a demand to downsize semiconductor devices used as non-volatile storage media for portable electronic devices such as portable phones and IC memory cards. It is particularly demanded to package semiconductor chips efficiently. One of the packaging techniques is to stack packages (built-in semiconductor devices) each having a semiconductor chip.

Figure 1:
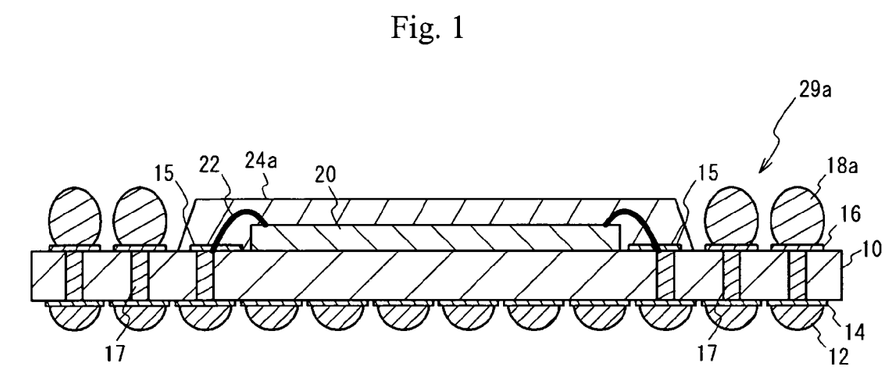
FIG. 1 is a cross-sectional view (part 1) of a semiconductor device in accordance with a first related art.
Figure 2:
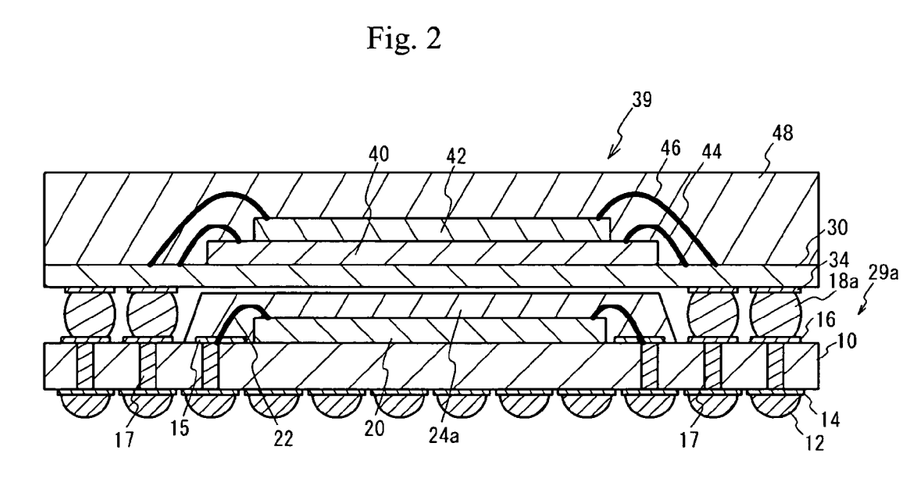
FIG. 2 is a cross-sectional view (part 2) of the semiconductor device in accordance with the first related art.

Referring to FIGS. 1 and 2, a description will now be given of a semiconductor device in accordance with a first related art, which is a built-in semiconductor device having a lower semiconductor device 29a and an upper semiconductor device 39, which devices are stacked. A semiconductor chip 20 is mounted on a wiring substrate 10 made of, for example, glass epoxy resin. Wires 22 electrically connect the semiconductor chip 20 and pads 15 provided on the wiring substrate 10. Solder balls 18a are provided on land electrodes 16 provided on a side of the wiring substrate 10 on which the semiconductor chip 20 is arranged. The semiconductor chip 20 is sealed with a resin seal portion 24a made of epoxy resin. The resin seal portion 24a is not provided to a region in which the solder balls 18a are arranged, but is provided in a central portion in which the semiconductor chip 20 is mounted. Solder balls 12 are provided on land electrodes 14 provided on another side of the wiring substrate 10 opposite to the side on which the semiconductor chip 20 is provided. Connection portions 17 electrically connect the land electrodes 16 and the solder balls 12. The solder balls 18a function as upper connection terminals for making connection with an upper semiconductor device. The semiconductor balls 12 function as lower connection terminals for making connections with a lower semiconductor device or a motherboard.

Referring to FIG. 2, the upper semiconductor device 39 has a wiring substrate 30 on which semiconductor chips 40 and 42 are stacked in this order. Wires 44 and 46 are used to electrically connect the semiconductor chips 40 and 42 and the wiring substrate 30. The semiconductor chips 40 and 42 are sealed with a resin seal portion 48. Since no built-in semiconductor device is provided on the top of the upper semiconductor device 39, no solder balls are provided on a side of the wiring substrate 30 on which the semiconductor chips 40 and 42 are provided. Thus, the resin seal portion 48 is provided on the whole upper surface of the wiring substrate 30. Land electrodes 34 are provided on another side of the wiring substrate 30 opposite to the side on which the semiconductor chips 40 and 42 are provided. The land electrodes 34 are connected to the solder balls 18a of the lower semiconductor device 29a. Thus, electrical connections are made between the upper semiconductor device 39 and the lower semiconductor device 29a. Connection portions for making connections between the wires 44 and 46 and the land electrodes 34 are not illustrated.

Japanese Patent Application Publication No. 2004-327855 (Document 1) discloses a semiconductor device in which the whole surface of a wiring substrate is sealed with a resin seal portion and upper connection terminals protrude from the resin seal portion.

The semiconductor device of the first related art does not have a high non-defective ratio because the lower semiconductor device 29a and the upper semiconductor device 39 in the stacked state have different degrees of thermal warping. In addition, the conventional semiconductor device has large financial and time burdens because it needs a metal mold for the resin seal portion 24 that matches in size with the semiconductor chip 20 of the lower semiconductor device 29a. Furthermore, the solder balls 18a are exposed and may be short-circuited due to a foreign particle or the like. It should be noted that the lower semiconductor device 29a and the upper semiconductor device 39 must be mutually positioned in order to connect these devices with the solder balls 18a. This positioning needs a specific tool, which will increase the manufacturing cost.

SUMMARY OF THE INVENTION

The present invention has been made taking the above into consideration and has an object of providing a semiconductor device capable of easily positioning built-in semiconductor devices to be stacked and a method of fabricating the semiconductor device.

The present invention includes a method of fabricating a semiconductor device including: mounting a semiconductor chip on a substrate; forming an upper connection terminal on a side of the substrate on which the semiconductor chip is mounted; forming a resin seal portion that seals the semiconductor chip and the upper connection terminal so that an upper surface of the upper connection terminal is exposed; and shaping the upper connection terminal so that the upper surface of the upper connection terminal becomes lower than an upper surface of the resin seal portion. With this modified structure, in stacking, a lower connection terminal of an upper semiconductor device to be stacked is fit into an opening defined in the resin seal portion in which the upper surface of the upper connection terminal is exposed. It is thus possible to easily position the semiconductor devices to be stacked.

The above structure may be modified so that shaping the upper connection terminal presses the upper connection terminal against a protrusion. With this modified structure, the upper connection terminal can be compressed so that the upper surface of the upper connection terminal may be made lower than the upper surface of the resin seal portion.

The above structure may be modified so that pressing the upper connection terminal arranges the semiconductor chip and the upper connection terminal in a resin layer from which the resin seal portion covering the protrusion; and forming the resin seal portion includes a step of sealing the semiconductor chip and the upper connection terminal with the resin. With this modified structure, the step of press-shaping the upper connection terminal may be carried out simultaneously with the step of forming the resin seal portion.

The above structure may be modified so that shaping the upper connection terminal includes a step of blasting the upper connection terminal from a top thereof. With this modified structure, the upper connection terminal can easily be formed and the production cost can be reduced.

The above structure may be modified: mounting the semiconductor chip includes a step of mounting multiple semiconductor chips; forming the resin seal portion includes a step of sealing the multiple semiconductor chips with the resin seal portion; and the method further comprises cutting the substrate and the resin seal portion into pieces. With this modified structure, the production cost can be reduced.

The above structure may be modified so as to further include connecting the upper connection terminal to a lower connection terminal of an upper semiconductor device. With this structure, the upper semiconductor device may be connected to the semiconductor chip.

The above structure may be modified so as to further include forming an insulating film on the upper connection terminal. It is possible to prevent a foreign particle from attaching to the upper connection terminal before the upper connection terminal is connected to the lower connection terminal of the upper semiconductor device.

The present invention also includes a semiconductor device including: a substrate; a semiconductor chip mounted on the substrate; upper connection terminals provided on a side of the substrate on which the semiconductor chip is provided; and a resin seal portion through which the upper connection terminals are penetrated, upper surfaces of the upper connection terminals being lower than an upper surface of the resin seal portion. With this modified structure, in stacking, a lower connection terminal of an upper semiconductor device to be stacked is fit into an opening defined in the resin seal portion in which the upper surface of the upper connection terminal is exposed. It is thus possible to easily position the semiconductor devices to be stacked.

The semiconductor device may be configured so that the upper surfaces of the upper connection terminals are lower than an upper surface of the resin seal portion located between adjacent ones of the upper connection terminals. The lower connection terminal of the upper semiconductor device to be stacked can be surely into the region formed in the resin seal portion on the upper connection terminal. Thus, the semiconductor devices to be stacked can be positioned easily.

The semiconductor device may be configured so that the resin seal portion is provided on an entire surface of the substrate. With this modified structure, the semiconductor devices have approximately identical degrees of warping of the respective substrates caused due to the difference in thermal expansion coefficient between the respective substrates and the resin seal portions.

The semiconductor device may be modified so as to further include lower connection terminals provided on an opposite side to the side of the substrate on which the semiconductor chip is provided, the lower connection terminals being connected to the semiconductor chip and the upper connection terminals. With this modified structure, the semiconductor device may be connected to a lower substrate or a lower semiconductor device.

The semiconductor device may be modified so as to further include an insulating film on the upper connection terminals. With this modified structure, it is possible to prevent a foreign particle from attaching to the upper connection terminal.

The semiconductor device may be modified so that the semiconductor chip is faceup mounted on the substrate. It is also possible to facedown mount the semiconductor chip on the substrate.

DESCRIPTION OF THE PREFERRED EMBODIMENTS

A description will be given, with reference to the accompanying drawings, of embodiments of the present invention.

First Embodiment

Figure 3A:
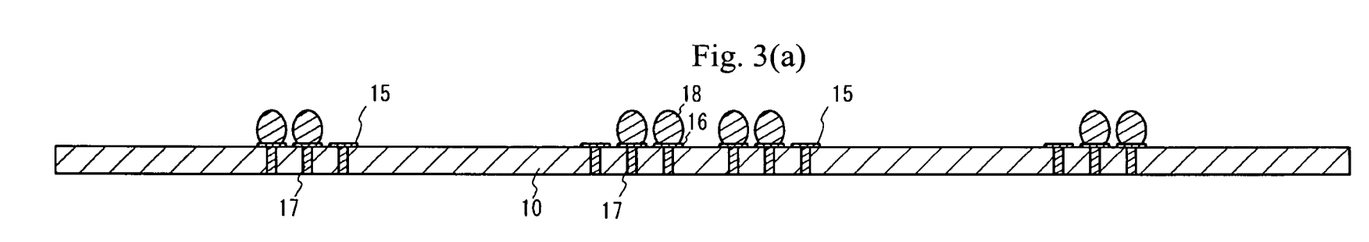
FIGS. 3(a) through 3(c) are respectively cross-sectional views (part 1) of a method of fabricating a semiconductor device in accordance with a first embodiment.
Figure 3B:
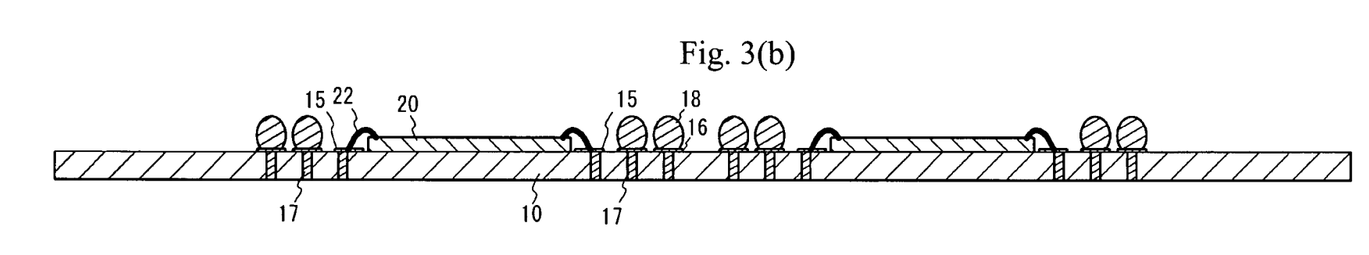
Figure 3C:
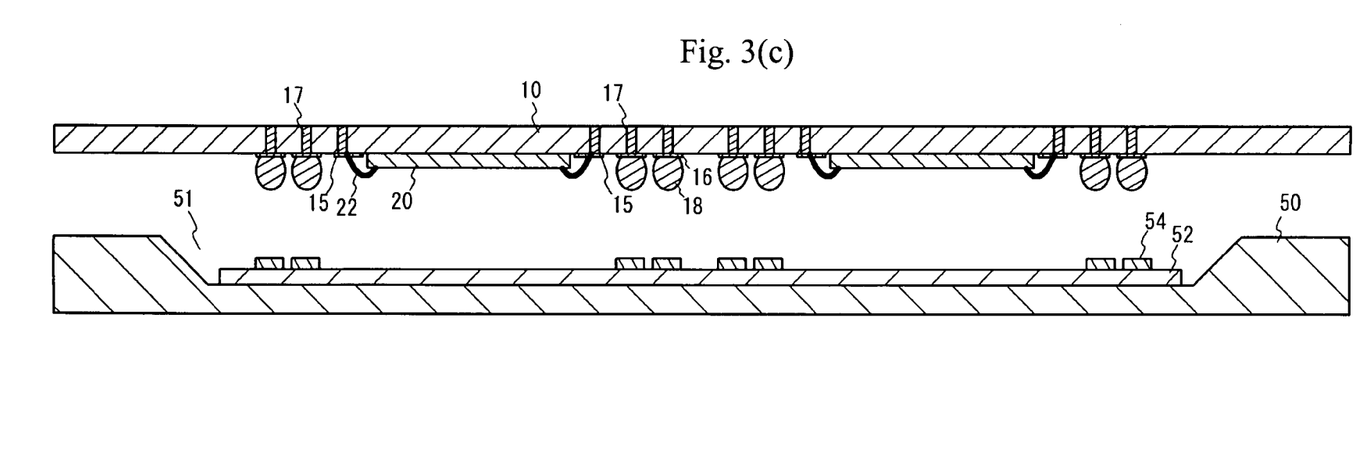

A first embodiment is an exemplary built-in semiconductor device for stacking. A description is now given of a method of fabricating the semiconductor device of the first embodiment with reference to FIGS. 3(a) through 4(c). Multiple semiconductor chips are mounted on the wiring substrate 10 in a transverse direction. In FIGS. 3(a) through 4(c), only two semiconductor chips 20 are illustrated for the sake of simplicity. Referring to FIG. 3(a), the land electrodes 16 are formed on the wiring substrate 10 that may be a printed-circuit board made of glass epoxy resin. The semiconductor balls 18, which may be slightly higher than 300 μm, are formed on the land electrodes 16. Referring to FIG. 3(b), the semiconductor chips 20, which may be 100 μm thick, are mounted on the wiring substrate 10 by using an adhesive. The wires 22 are provided to make electrical connections between semiconductor chips 20 and the pads 15 on the wiring substrate 10. Referring to FIG. 3(c), a metal mold 50 is arranged, which has a molding portion 51 (recess portion of the metal mold) for forming the resin seal portion 24 on the side of the wiring substrate 10 on which the semiconductor chips 20 are mounted. A metal plate 52 having protrusions 54 is disposed on the bottom of the molding portion 51. The depth from the upper surface of the metal mold 50 to the metal plate 52 may be approximately 300 µm, and the protrusions 54 may be approximately 100 µm high. The protrusions 54 are disposed so as to face the solder balls 1 8 provided on the wiring substrate 10.

Figure 4A:
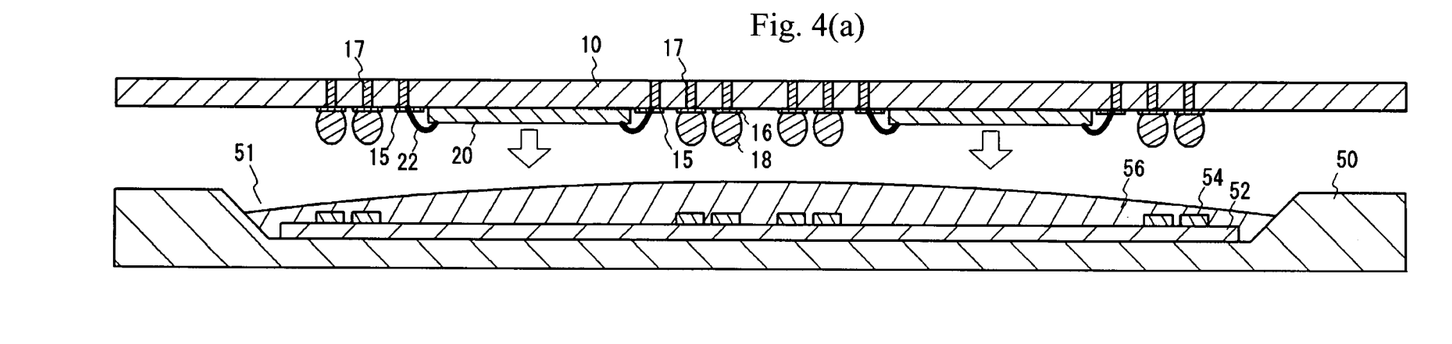
FIGS. 4(a) through 4(c) are respectively cross-sectional views (part 2) of the method of fabricating the semiconductor device in accordance with the first embodiment.
Figure 4B:
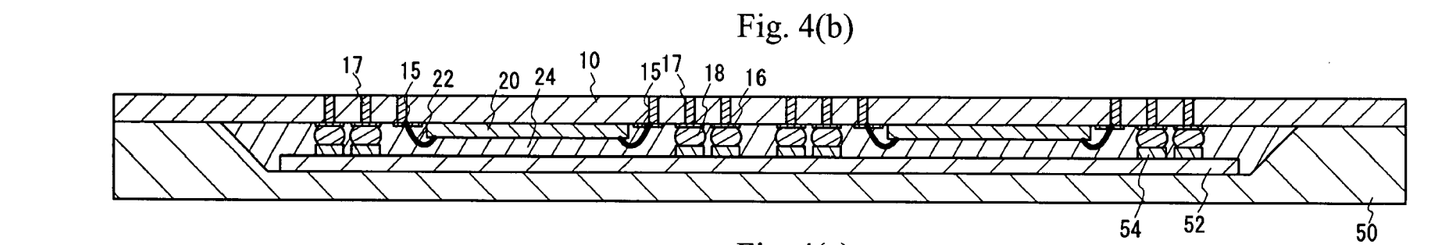
Figure 4C:
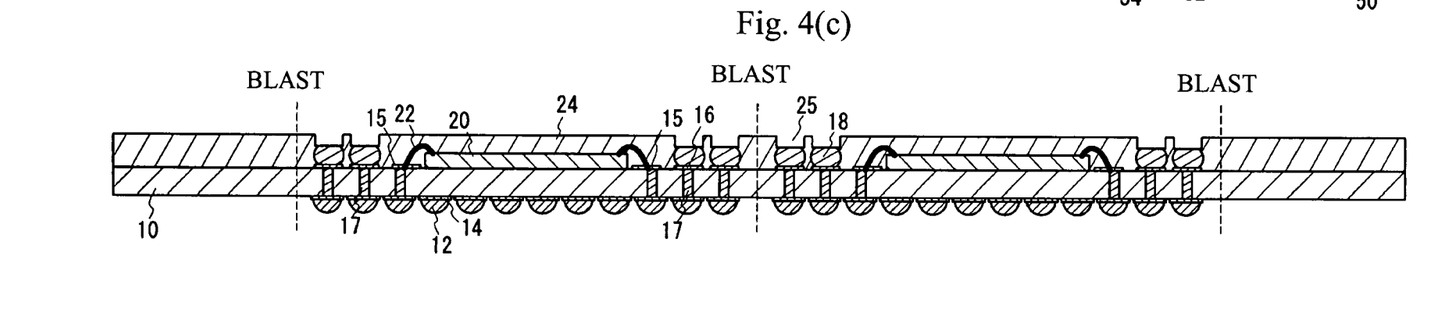

Referring to FIG. 4(a), thermoset epoxy resin 56 is provided to the molding portion 51 of the metal mold 50 in an uncured state. The metal mold 50 is heated to approximately 175° C. to melt the epoxy resin. Referring to FIG. 4(b), the wiring substrate 10 and the metal mold 50 are brought into contact. At that time, the solder balls 18 and the protrusions 54 contact each other. The solder balls 18 are higher than 300 µm, while the height from the upper surface of the metal mold 50 to the upper surfaces of the protrusions 54 is approximately 200 µm. Thus, the solder balls 18 are pressed against the protrusions 54, and are shaped so as to have a reduced height. The resultant solder balls 18 may be approximately 200 µm high. The epoxy resin 56 is press-shaped and cured to thus form the resin seal portions 24 with which the semiconductor chips 20 and the solder balls 18 are sealed. The resin seal portions 24 may be approximately 300 µm thick. The heights of the solder balls 18, the protrusions 54 and the depth from the upper surface of the metal mold 50 to the metal plate 52 may be selected so that the heights of the solder balls 18 can be reduced. Referring to FIG. 4(c), the metal mold 50 is removed. The resin seal portions 24 and the wiring substrate 10 are cut into pieces by dicing or the like, so that the built-in semiconductor devices can be completed.

Figure 5:
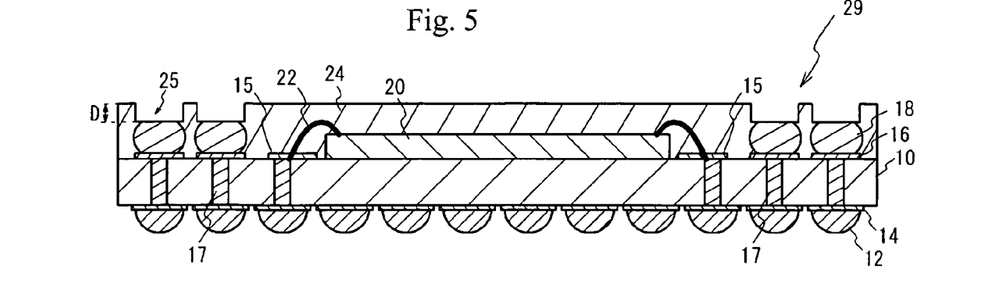
FIG. 5 is a cross-sectional view of the semiconductor device in accordance with the first embodiment.

FIG. 5 is a cross-sectional view of the built-in semiconductor device in accordance with the first embodiment. As compared to the first related art, the resin seal portion 24 is formed so as to cover the whole surface of the wiring substrate 10. The upper surfaces of the solder balls 18 are deeper than the upper surfaces of the resin seal portions 24 by a depth D, which may be approximately 100 µm. That is, the upper surfaces of the solder balls 18 are lower than the upper surfaces of the resin seal portions 24. Openings 25 are defined in the resin seal portion 24 so as to be located above the solder balls 18. The upper surfaces of the solder balls 18 are exposed. Thus, the solder balls 18 are penetrated through the resin seal portion 24. The other structures are similar to those of the first conventional art, and like members are given like numeral numbers with a detailed description thereof being omitted.

Second Embodiment

Figure 6:
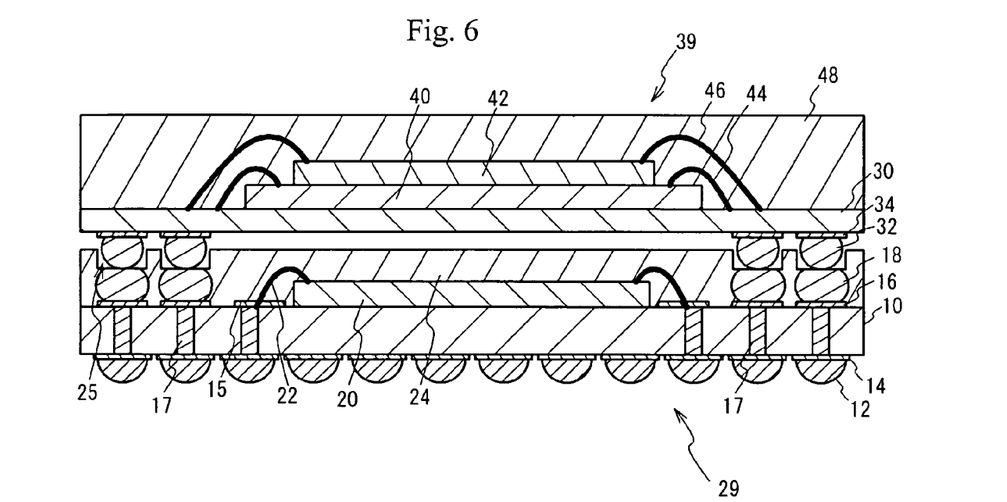
FIG. 6 is a cross-sectional view of a method of fabricating a semiconductor device in accordance with a second embodiment.

A second embodiment has an exemplary arrangement in which a semiconductor device is stacked on the built-in semiconductor device in accordance with the first embodiment. FIG. 6 is a cross-sectional view of a method of fabricating a semiconductor device in accordance with the second embodiment. One built-in semiconductor device of the first embodiment is arranged as a lower semiconductor device 29, and the upper semiconductor device 39 employed in the aforementioned related art is arranged on the lower semiconductor device 29. In this arrangement, solder balls 32 of the upper semiconductor device 39 are fit into the openings 25 formed in the resin seal portion 24 of the lower semiconductor device 29. Then, the lower semiconductor device 29 and the upper semiconductor device 39 are heated to melt the solder balls 18 and 32, so that the semiconductor device of the second embodiment can be completed.

Figure 7:
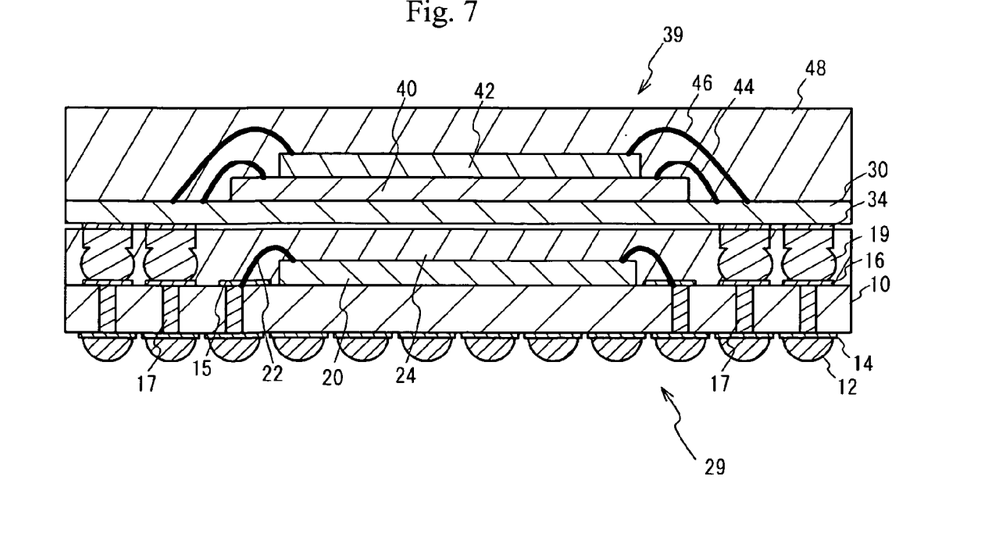
FIG. 7 is a cross-sectional view of the semiconductor device in accordance with the second embodiment.

FIG. 7 is a cross-sectional view of a semiconductor device in accordance with the second embodiment. As compared to the first related art shown in FIG. 2, the resin seal portion 24 is formed on the entire surface of the wiring substrate 10, and the solder balls 19 are penetrated through the resin seal portion 24. The other structures are similar to those of the related art shown in FIG. 2 and like members are given like numeral numbers with a detailed description thereof being omitted.

In accordance with the first embodiment, the semiconductor device has the solder balls 18 (upper connection terminals) on the side of the wiring substrate 10 on which the semiconductor chip 20 is provided, and the resin seal portion 24 with which the semiconductor chip 20 and the solder balls 18 are sealed so that the solder balls 18 are penetrated through the resin seal portion 24. The upper surfaces of the solder balls 18 are provided at a level lower than that at which the upper surface of the resin seal portion 24 is located. Thus, as shown in FIG. 6 related to the second embodiment, the solder balls 32 of the upper semiconductor device 39 are fit into the openings 25 formed in the resin seal portion 24 located above the solder balls 18 in the process of connecting the solder balls 18 and the solder balls 32. It is thus easy to mutually position the lower semiconductor device 29 and the upper semiconductor device 39.

The upper surfaces of the solder balls 18 are lower than the upper surfaces of the resin seal portion 24, so that the solder balls 32 can easily be fit into the openings 25. It is thus possible to mutually position the lower semiconductor device 29 and the upper semiconductor device 39 much more easily.

Furthermore, the resin seal portion 24 is provided on the whole surface of the wiring substrate 10. Thus, when the upper semiconductor device 39 is stacked on the wiring substrate 10, the resin seal portions 24 and 48 are provided on the entire surfaces for both the lower semiconductor device 29 and the upper semiconductor device 39. Thus, the wiring substrates 10 and 30 respectively included in the lower semiconductor device 29 and the upper semiconductor device 39 have similar degrees of thermal warping due to the difference in thermal expansion coefficient between the wiring substrates 10, 30 and the resin sealing portions 24, 48. It is thus possible to restrain degradation of the non-defective ratio caused by thermal warping of the wiring substrates 10 and 30. Further, there is no need to produce the metal mold for the resin seal portion 24 so as to match in size with the semiconductor chip 20 of the lower semiconductor device 29. This reduces the financial and time burdens. Furthermore, the resin seal portion 24 protects the solder balls 18 so that short-circuiting therebetween due to foreign particles can be avoided.

The solder balls 12 (lower connection terminals) that are connected to the semiconductor chip 20 and the solder balls 18 are provided on the side of the wiring substrate 10 opposite to the side on which the semiconductor chip 20 is provided. This makes it possible to connect the lower semiconductor device 29 to the motherboard or a lower semiconductor device.

In the method of fabricating the semiconductor device in accordance with the first embodiment, the semiconductor chip 20 is mounted on the wiring substrate 10, as shown in FIG. 3(b). As shown in FIG. 3(a), the solder balls 18 are formed on the side of the wiring substrate 10 on which the semiconductor chip 20 is to be mounted. As shown in FIG. 4(b), the resin seal portion 24 is formed so as to seal the semiconductor chip 20 and the solder balls 18 in such a manner that the upper surfaces of the solder balls 18 are exposed. The solder balls 18 are formed so that the upper surfaces thereof are made lower than the upper surface of the resin seal portion 24. Thus, as shown in FIG. 6 related to the second embodiment, the lower semiconductor device 29 and the upper semiconductor device 39 can easily be positioned.

As shown in FIG. 4(b), the solder balls 18 are pressed against the protrusions 54 and are thus shaped. Thus, the solder balls 18 can be compressed and shaped easily so that the upper surfaces of the solder balls 18 are lower than the upper surface of the resin seal portion 24.

As shown in FIG. 4(a), the resin 56 from which the resin seal portion 24 is shaped later is provided so as to cover the protrusions 54. When the solder balls 18 are pressed against the protrusions 54, the semiconductor chip 20 and the solder balls 18 are put in the resin 56. As shown in FIG. 4(b), the semiconductor chip 20 and the solder balls 18 are sealed with the resin 56 so that the resin seal portion 24 can be formed. It is thus possible to simultaneously perform the step of pressing the solder balls 18 and the step of forming the resin seal portion 24 and to thus reduce the production cost.

Furthermore, as shown in FIG. 3(b), the multiple chips 20 are mounted on the wiring substrate 10, and are sealed with the single resin seal portion 24, as shown in FIG. 4(b). As shown in FIG. 4(c), the wiring substrate 10 and the resin seal portion 24 are cut into pieces. Thus, the metal mold 50 for molding the resin seal portion 24 does not depend on the size of the semiconductor chips 20. Thus, even when semiconductor chips having different chip sizes are sealed, the single metal mold 50 can be commonly used and the production cost can be reduced.

Third Embodiment

Figure 8A:
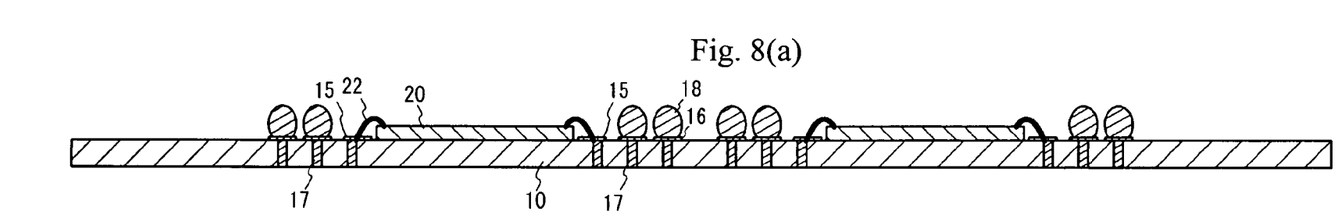
FIGS. 8(a) through 8(c) are respectively cross-sectional views (part 1) of a method of fabricating a semiconductor device in accordance with a third embodiment.
Figure 8B:
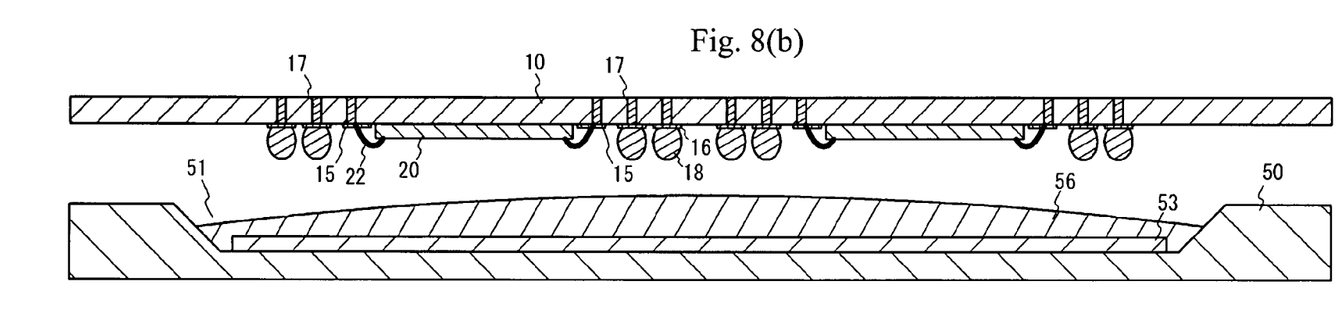
Figure 8C:
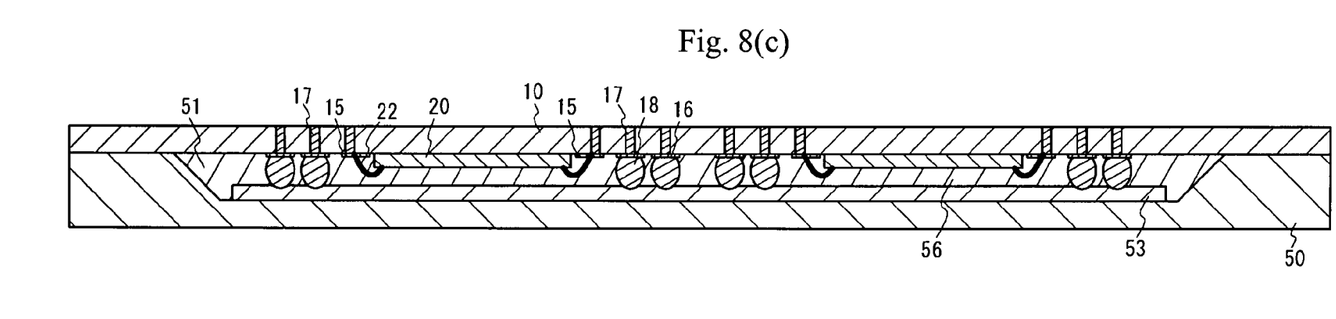

A third embodiment is an exemplary device in which the solder balls 18 of the lower semiconductor device 29 are formed in a manner different from the above-mentioned manner. A description is now given, with reference to FIG. 8(a) through 9(b), of a method of fabricating a semiconductor device in accordance with the third embodiment. Referring to FIG. 8(a), the processes shown in FIGS. 3(a) and 3(b) in association with the first embodiment are carried out. Referring to FIG. 8(b), the metal mold 50 is disposed which has the molding portion 51 for shaping the resin seal portion 24 on the side of the wiring substrate 10 on which the semiconductor chip 20 is arranged. A sheet 53 that is softer than the solder balls 18 is arranged. Thermoset epoxy region 56 is given to the molding portion 51 of the metal mold 50 in an uncured state. The metal mold 50 is heated to approximately 175° C. to melt the epoxy resin. Referring to FIG. 8(c), the wiring substrate 10 and the metal mold 50 are brought into contact. At that time, the solder balls 18 contact the sheet 53. The sheet 53 is softer than the solder balls 18, and the leading ends thereof are thus buried into the sheet 53. The epoxy resin 56 is compressed and cured, so that the resin seal portion 24 that seals the semiconductor chips 20 and the solder balls 18 can be shaped.

Figure 9A:
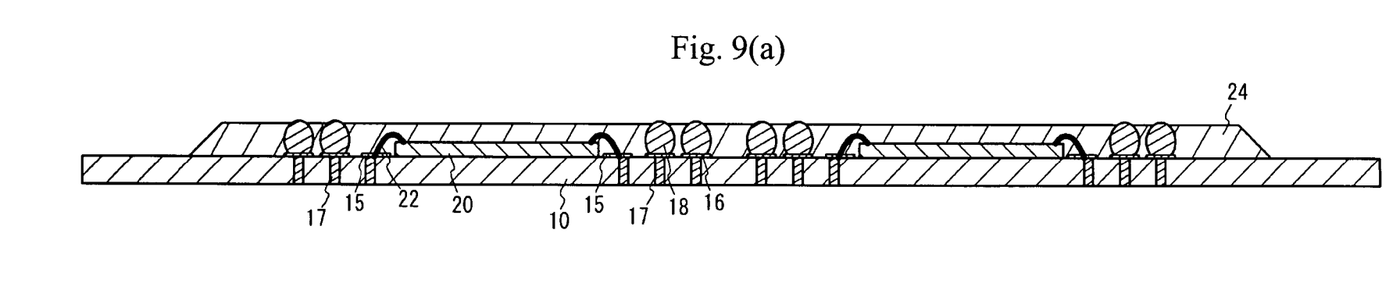
FIGS. 9(a) and 9(b) are respectively cross-sectional views (part 2) of the method of fabricating the semiconductor device in accordance with the third embodiment.
Figure 9B:
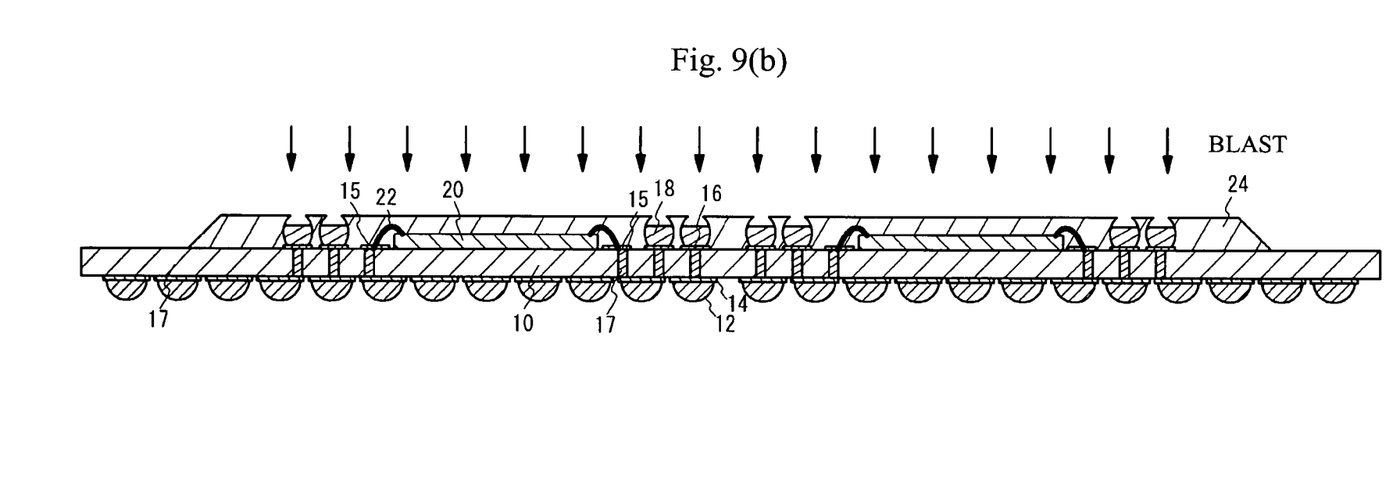

Referring to FIG. 9(a), the metal mold 50 is removed. The resin seal portion 24 is formed on the wiring substrate 10. Since the leading ends of the solder balls 18 are buried in the sheet 53, the solder balls 18 are penetrated through the resin seal portion 24 and the upper surfaces of the solder balls 18 are positioned at a level higher than the upper surface of the resin seal portion 24. Referring to FIG. 9(b), the resin sealing portion 24 and the solder balls are sandblasted from the upper sides thereof (sand-blasting). Metal such as solder is sandblasted more easily than the resin seal portion 24. Thus, the leading ends of the solder balls 18 are sandblasted so that the upper surfaces of the solder balls 18 can be lower than the upper surface of the resin sealing portion 24. After that, the resin seal portion 24 and the wiring substrate 10 are cut into pieces as shown in FIG. 4(b) in association with the first embodiment, so that the semiconductor devices of the third embodiment can be completed.

The third embodiment employs sandblasting for shaping of the solder balls 18, and does not need the metal plate 52 and the protrusions 54 used in the first embodiment. Thus, the production cost can be reduced.

Fourth Embodiment

A fourth embodiment is an exemplary device in which the semiconductor chip 20 of a lower semiconductor device 29b is facedown mounted.

Figure 10:
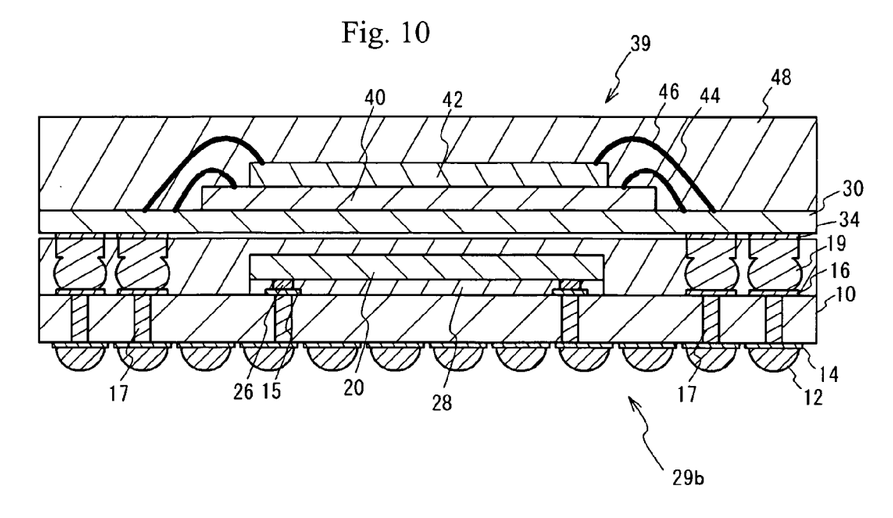
FIG. 10 is a cross-sectional view of a semiconductor device in accordance with a fourth embodiment.

Referring to FIG. 10, the semiconductor chip 20 is electrically connected to the pads 15 on the wiring substrate 10 by bumps 26 made of, for example, gold or copper. Like the device shown in FIG. 7, the pads 15 and the land electrodes 16 are connected to the land electrodes 14 via the connection portions 17. An underfill 28 made of epoxy resin is provided between the wiring substrate 10 and the semiconductor chip 20. The other structures are the same as those of the second embodiment shown in FIG. 7, and like members are given like numeral numbers with a detailed description being omitted.

According to the fourth embodiment, the semiconductor chip 20 can be flip-chip mounted on the wiring substrate 10, that is, facedown mounted. The semiconductor chips 20 are faceup mounted on the wiring substrate 10 in the first through third embodiments.

Fifth Embodiment

Figure 11:
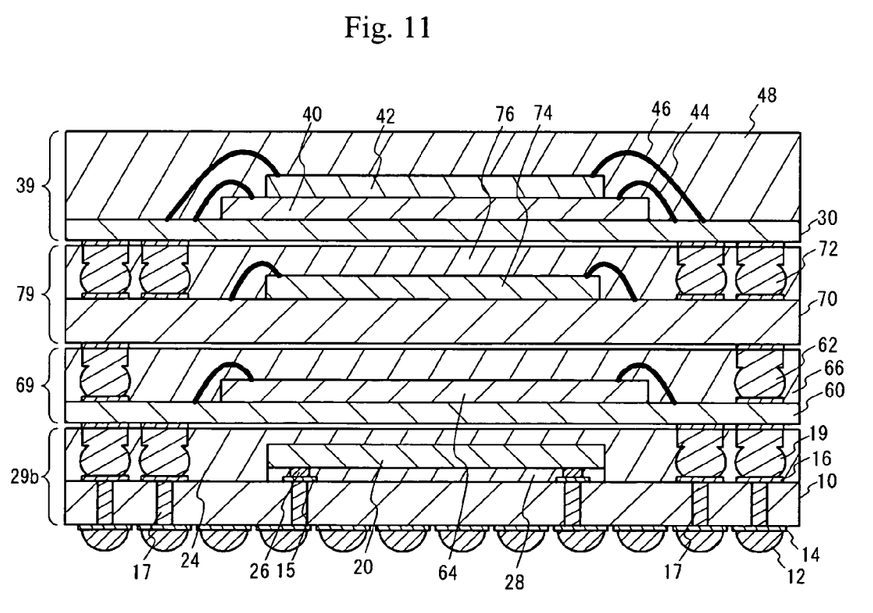
FIG. 11 is a cross-sectional view of a semiconductor device in accordance with a fifth embodiment.

A fifth embodiment is an exemplary device in which multiple built-in semiconductor devices are stacked. Referring to FIG. 11, the semiconductor device of the fifth embodiment has an arrangement in which built-in semiconductor devices 69 and 79 are stacked on the lower semiconductor device 29b of the fourth embodiment in that order, and the upper semiconductor device 39 of any of the second through fourth embodiments is stacked on the semiconductor device 79. In the built-in semiconductor device 69, a semiconductor chip 64 is mounted on a wiring substrate 60, and is sealed with a resin seal portion 66. The built-in semiconductor device 69 is connected to the lower semiconductor device 29b by the solder balls 19. In the built-in semiconductor device 79, a semiconductor chip 74 is mounted on a wiring substrate 70, and is sealed with a resin seal portion 76. The built-in semiconductor device 79 is connected to the built-in semiconductor device 69 by solder balls 62. The upper semiconductor device 39 is connected to the built-in semiconductor device 79 by solder balls 72. The lower semiconductor device 29b and the upper semiconductor device 39 have same structures as those of the fourth and second embodiments, respectively, and like members are given like numeral numbers with a detailed description being omitted.

The built-in semiconductor devices 69 and 79 may be fabricated in the same manner as the first or third embodiment, and the connections between the lower semiconductor device 29b, the built-in semiconductor devices 69 and 79 and the upper semiconductor device 39 may be made in the same manner as those of the second embodiment. Three or more built-in semiconductor devices may be stacked.

Sixth Embodiment

Figure 12A:
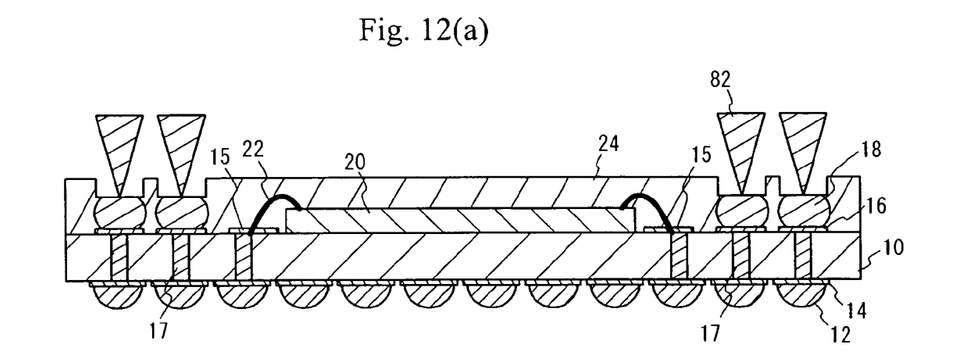
FIGS. 12(a) through 12(c) are cross-sectional views of a semiconductor device in accordance with a sixth embodiment.
Figure 12B:
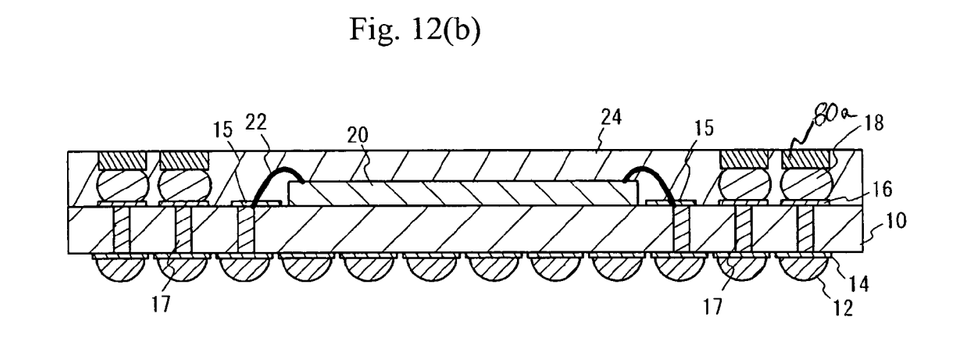

A sixth embodiment is an exemplary technique for transporting the semiconductor devices of the first embodiment. Referring to FIG. 12(a), test probes 82 are brought into contact with the solder balls 18 in the openings formed in the resin seal portions 24 in the semiconductor device 29 of the first embodiment. In this state, the characteristics of the semiconductor device 29 are tested. After that, an insulating film is formed on the solder balls 18 in the openings 25. As shown in FIG. 12(b), an insulating film 80a may be formed in only the openings 25. It is also possible to form an insulating film 80b on the openings 25 and the resin seal portion 24.

Figure 12C:
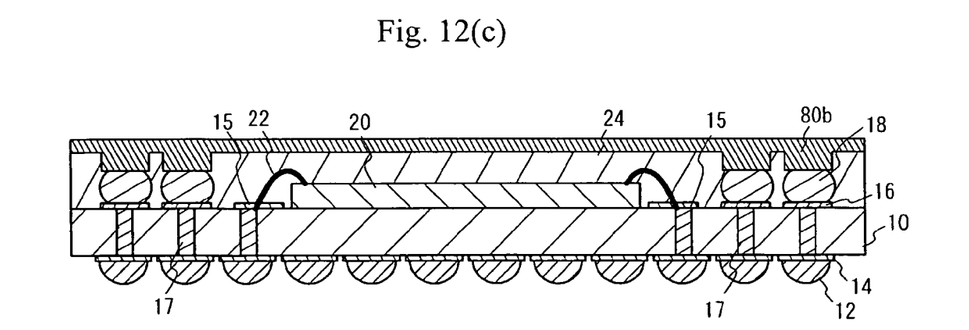

In accordance with the sixth embodiment, the semiconductor devices may be transported and stored in the state in which the openings 25 are covered with the insulating film 80a or 80b. As in the case of the second and third embodiments, the insulating film 80a or 80b are removed before the semiconductor device 39 is mounted on the lower semiconductor device 29. It is thus possible to prevent foreign particles from attaching to the solder balls 18 while the semiconductor device 29 is transported or stored. The insulating film 80a or 80b may be made of, for example, polyimide. The insulating film 80a or 80b may be etched by cyclohexanone, for example, so that the film can be removed without removing the resin seal portion 24 made of epoxy resin.

The wiring substrate 10 in the first through sixth embodiments used as the substrate is a printed-circuit board. The wiring substrate 10 may be configured so as to have an insulating main body to which electrically conductive land electrode, pads and/or wiring lines are provided. The upper and lower connection terminals are the solder balls 18 and 12, respectively, in the first through sixth embodiment. Solder may be lead-tin (PbSn) solder, lead-free solder (such as SnAgCu), or tin-zinc (SnZn) solder. The upper and lower connection terminals may be made of a metal other than solder, and may be bumps of, for example, Au or Cu. The upper and lower connection terminals may be protruding conductors having the function of electrically connecting the lower semiconductor device 29 and the upper semiconductor device 39 or motherboard.

Embodiments generally relate to semiconductor devices. More particularly, embodiments allow for lower-cost semiconductor devices. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 13:
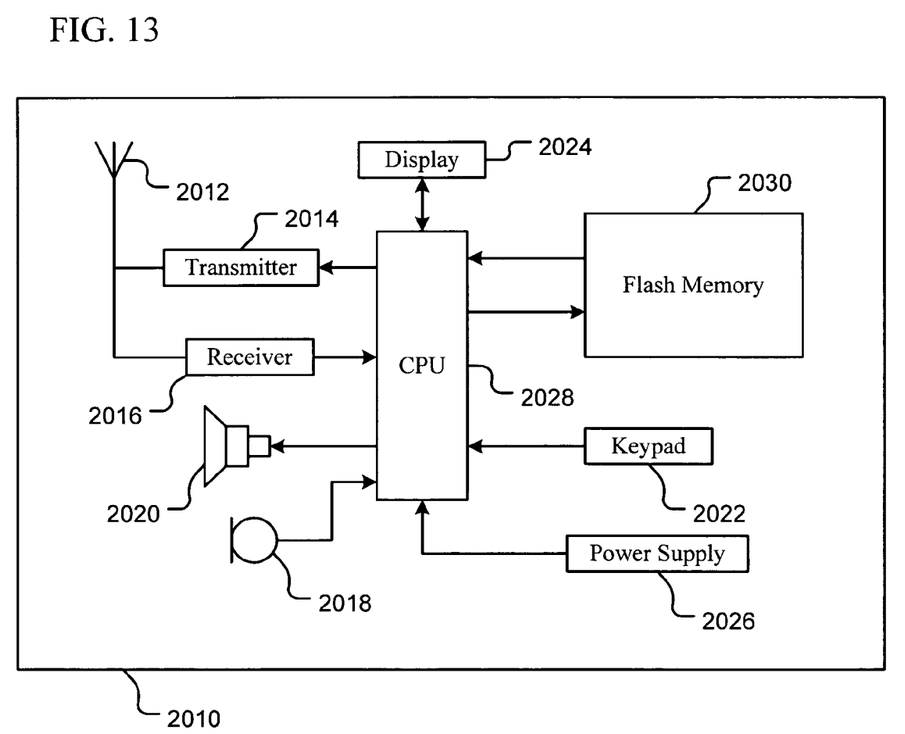
FIG. 13 illustrates a block diagram of a conventional portable phone, upon which embodiments may be implemented.

FIG. 13 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a substrate, a semiconductor chip mounted on the substrate, upper connection terminals provided on a side of the substrate on which the semiconductor chip is provided, and a resin seal portion through which the upper connection terminals are penetrated, where upper surfaces of the upper connection terminals are lower than an upper surface of the resin seal portion. According to various embodiments, it is possible to provide a semiconductor device, such as flash memory, that is capable of easily positioning built-in semiconductor devices to be stacked. The present invention also provides a method of manufacturing such a semiconductor device. As a result, the flash memory 2030 is able to be manufactured at a much lower cost than previous. This decreased cost for the flash memory translates into decreased cost for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 14:
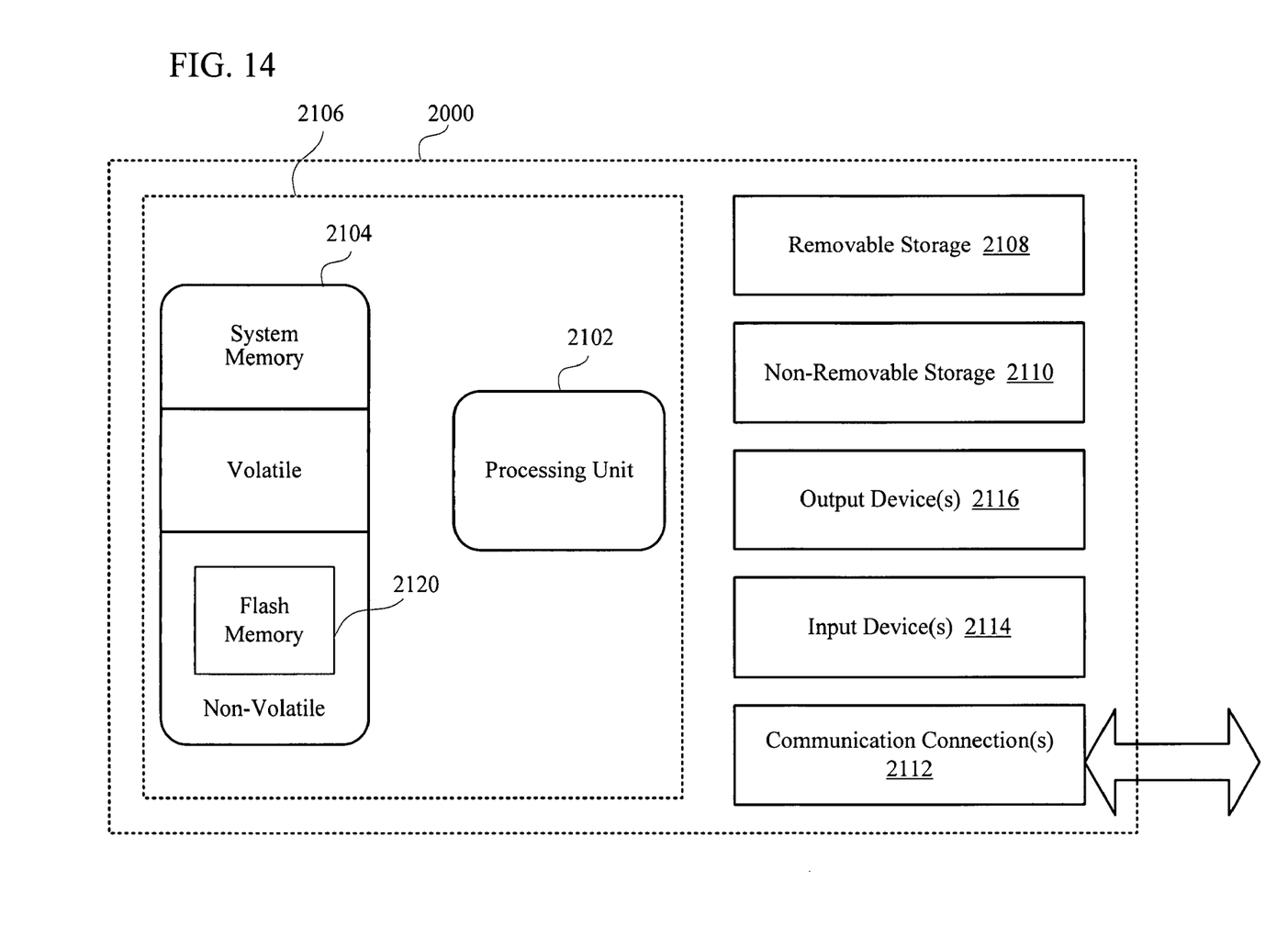
FIG. 14 illustrates a block diagram of a computing device, upon which embodiments may be implemented.

FIG. 14 illustrates a block diagram of a computing device 2100, upon which embodiments of the present invention can be implemented. Although computing device 2100 is shown and described in FIG. 14 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 14.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 14 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a substrate, a semiconductor chip mounted on the substrate, upper connection terminals provided on a side of the substrate on which the semiconductor chip is provided, and a resin seal portion through which the upper connection terminals are penetrated, where upper surfaces of the upper connection terminals are lower than an upper surface of the resin seal portion. According to various embodiments, it is possible to provide a semiconductor device, such as flash memory, that is capable of easily positioning built-in semiconductor devices to be stacked. The present invention also provides a method of manufacturing such a semiconductor device. As a result, the flash memory 2030 is able to be manufactured at a much lower cost than previous. This decreased cost for the flash memory translates into decreased cost for for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 15:
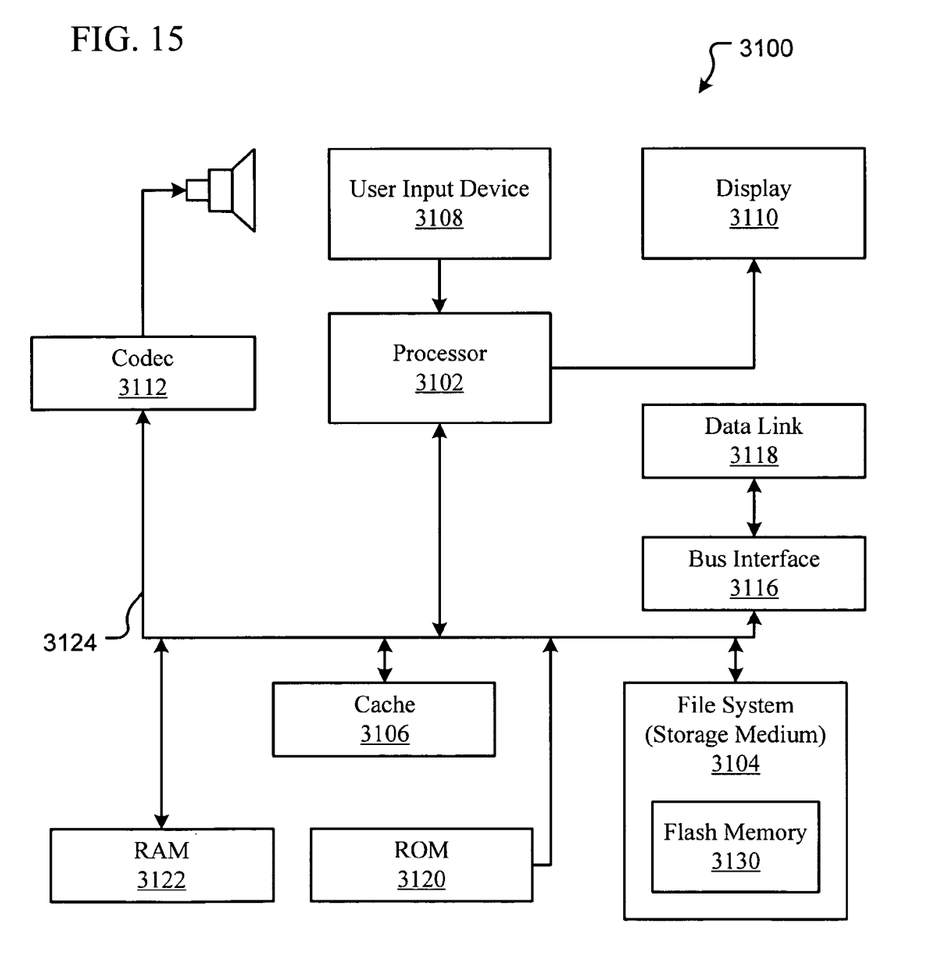
FIG. 15 illustrates an exemplary portable multimedia device, or media player, in accordance with various embodiments of the present invention.

FIG. 15 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a substrate, a semiconductor chip mounted on the substrate, upper connection terminals provided on a side of the substrate on which the semiconductor chip is provided, and a resin seal portion through which the upper connection terminals are penetrated, where upper surfaces of the upper connection terminals are lower than an upper surface of the resin seal portion. According to various embodiments, it is possible to provide a semiconductor device, such as flash memory, that is capable of easily positioning built-in semiconductor devices to be stacked. The present invention also provides a method of manufacturing such a semiconductor device. As a result, the flash memory 2030 is able to be manufactured at a much lower cost than previous. This decreased cost for the flash memory translates into decreased cost for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

The preferred embodiments have been described. The present invention is not limited to the specifically described embodiments, but various variations and modifications may be made within the range of the claimed invention.

What is claimed is:

1. A wireless communications device, comprising:
   a memory comprising:
   a substrate;
   a semiconductor chip mounted on the substrate;
   upper connection terminals provided on a side of the substrate on which the semiconductor chip is provided wherein said upper connection terminals comprise solder balls; and
   a resin seal portion through which the upper connection terminals are penetrated,
   upper surfaces of the upper connection terminals being lower than an upper surface of the resin seal portion and higher than an upper surface of the semiconductor chip;
   a processor;
   a communications component;
   a transmitter;
   a receiver; and
   an antenna connected to the transmitter circuit and the receiver circuit.

2. The wireless communications device of claim 1, wherein said flash memory is NAND flash memory.

3. The wireless communications device of claim 1, wherein said flash memory is NOR flash memory.

4. The wireless communications device of claim 1, wherein said flash memory comprises at least one memory cell operable to store more than one bit.

5. A computing device comprising:
   a processor;
   an input component;
   an output component;
   a memory comprising:
   a substrate;
   a semiconductor chip mounted on the substrate;
   upper connection terminals provided on a side of the substrate on which the semiconductor chip is provided wherein said upper connection terminals comprise solder balls; and
   a resin seal portion through which the upper connection terminals are penetrated, upper surfaces of the upper connection terminals being lower than an upper surface of the resin seal portion and higher than an upper surface of the semiconductor chip.

6. The computing device of claim 5, wherein said computing device is a personal computer (PC).

7. The computing device of claim 5, wherein said computing device is a personal digital assistant (PDA).

8. The computing device of claim 5, wherein said computing device is a gaming system.

9. A portable media player comprising:
a processor;
a cache;
a user input component;
a coder-decoder component; and
a memory comprising:
a substrate;
a semiconductor chip mounted on the substrate;
upper connection terminals provided on a side of the substrate on which the semiconductor chip is provided wherein said upper connection terminals comprise solder balls; and
a resin seal portion through which the upper connection terminals are penetrated,
upper surfaces of the upper connection terminals being lower than an upper surface of the resin seal portion and higher than an upper surface of the semiconductor chip.

10. The portable media player of claim 9, wherein said portable media player is a portable music player.

11. The portable media player of claim 9, wherein said portable media player is a portable video player.

* * * * *